United States Patent
Inokuma

(10) Patent No.: US 8,004,010 B2
(45) Date of Patent: Aug. 23, 2011

(54) SEMICONDUCTOR DEVICE AND A METHOD OF MANUFACTURING THE SAME

(75) Inventor: Hideki Inokuma, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 183 days.

(21) Appl. No.: 12/035,260

(22) Filed: Feb. 21, 2008

(65) Prior Publication Data
US 2008/0203429 A1 Aug. 28, 2008

(30) Foreign Application Priority Data
Feb. 22, 2007 (JP) ................. 2007-042394

(51) Int. Cl.
*H01L 27/11* (2006.01)
*H01L 29/778* (2006.01)
*H01L 21/336* (2006.01)

(52) U.S. Cl. ............... 257/190; 438/285; 257/E29.246; 257/E21.403; 257/E27.099

(58) Field of Classification Search .................. 257/190, 257/E21.575–21.597, E21.627, E21.641
See application file for complete search history.

(56) References Cited

U.S. PATENT DOCUMENTS

| | | | | |
|---|---|---|---|---|
| 4,177,096 A | * | 12/1979 | Okumura et al. ............ | 257/346 |
| 5,621,232 A | * | 4/1997 | Ohno ............................ | 257/384 |
| 2005/0242399 A1 | * | 11/2005 | Huang ........................... | 257/355 |
| 2006/0231826 A1 | | 10/2006 | Kohyama | |

FOREIGN PATENT DOCUMENTS

| | | |
|---|---|---|
| JP | 2003-109969 | 4/2003 |
| JP | 2004-273972 | 9/2004 |
| JP | 2005-158898 | 6/2005 |
| JP | 2005-197575 | 7/2008 |

OTHER PUBLICATIONS

M. Kanda, et al., "Highly Stagle 65nm Node (CMOS5) 0.56μm² SRAM Cell Design for Very Low Operation Voltage," 2003 Symposium on VLSI Technology Digest of Technical Papers, pp. 13-14.

H. Nii, et al., "A 45nm High Performance Bulk Logic Platform Technology (CMOS6) using Ultra High NA(1.07) Immersion Lithography with Hybrid Dual-Damascene Structure and Porous Low-k BEOL", 2006 IEDM Technical Digest, pp. 685-688.

Notice of Reasons for Rejection, issued by Japanese Patent Office, dated Mar. 29, 2011, in a Japanese patent application No. 2007-042394 (3 pages), and English translation thereof.

* cited by examiner

*Primary Examiner* — David Vu
*Assistant Examiner* — Jonathan Han
(74) *Attorney, Agent, or Firm* — Finnegan, Henderson, Farabow, Garrett & Dunner, L.L.P.

(57) ABSTRACT

In a semiconductor device with a shared contact, a gate electrode is formed via a gate insulating film on a semiconductor substrate and a sidewall insulating film is formed on both side faces of the gate electrode. At least one of the surface parts of the semiconductor substrate adjacent to both sides of the gate electrode is removed beyond the lower part of the sidewall insulating film and to the underside of the gate electrode. Then, the gate insulating film exposed in the remove part is removed. An impurity-doped semiconductor layer is formed in the part where the semiconductor substrate and the gate insulating film have been removed.

6 Claims, 9 Drawing Sheets

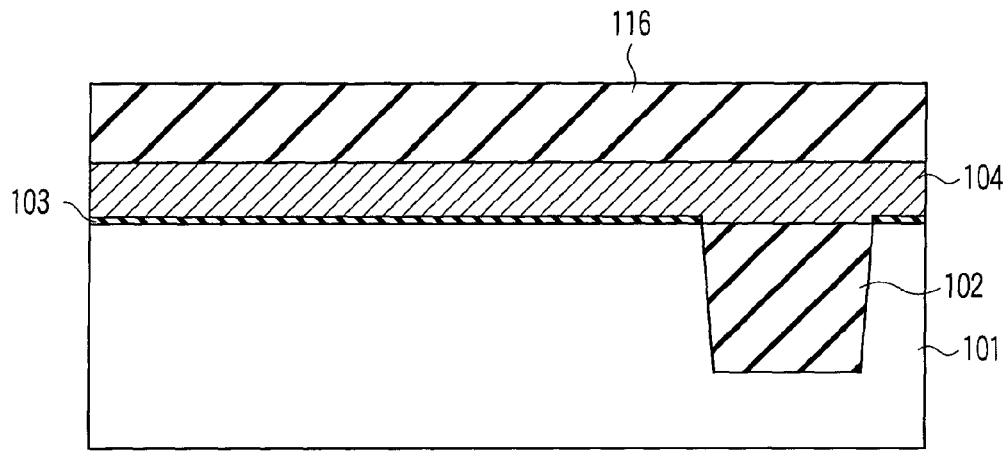
F I G. 3A
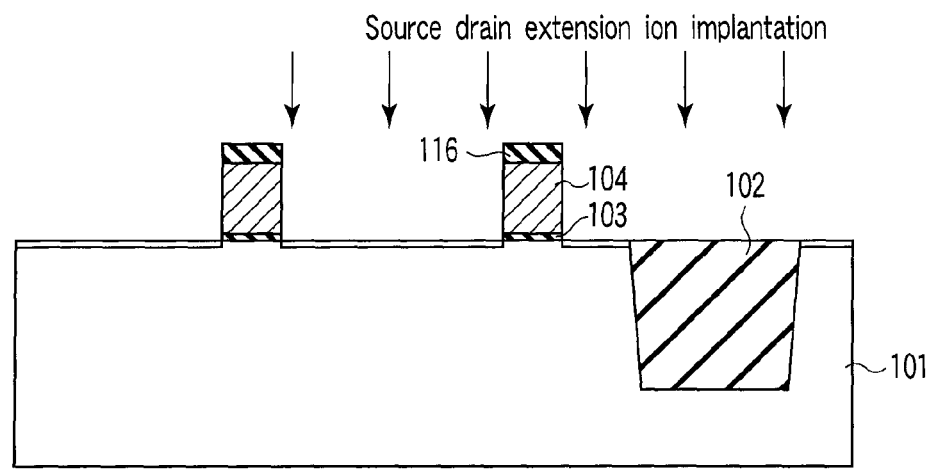
F I G. 3B
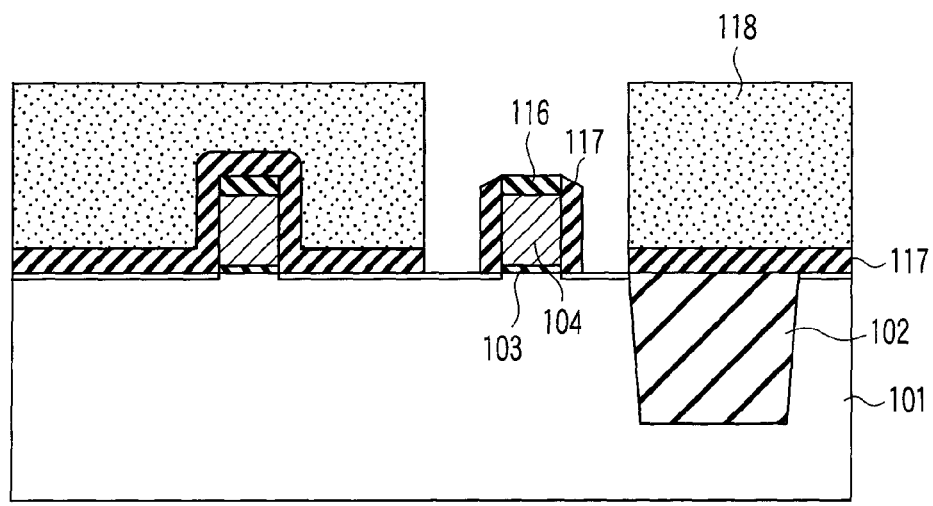
F I G. 3C

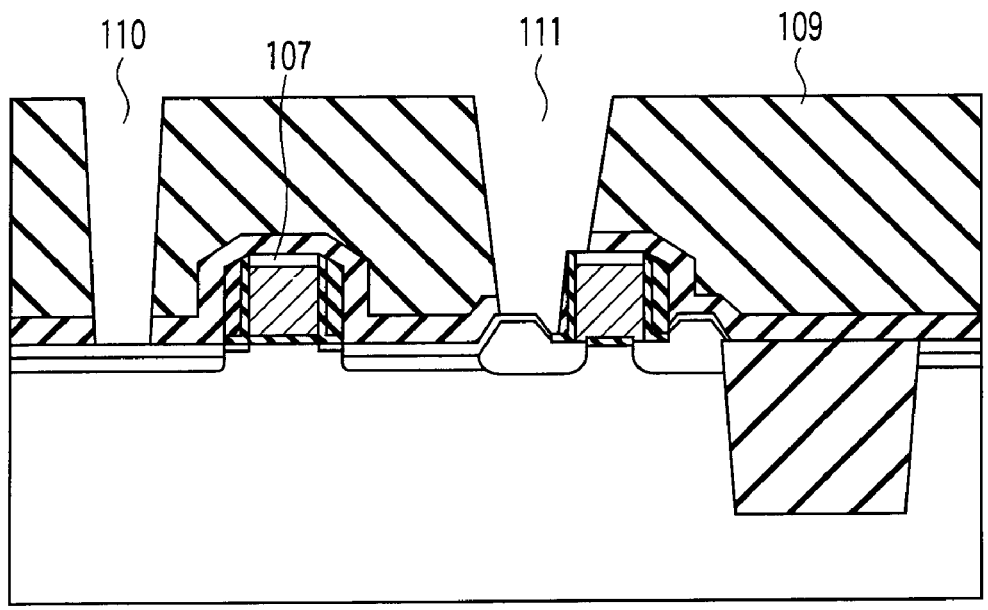
F I G. 4A
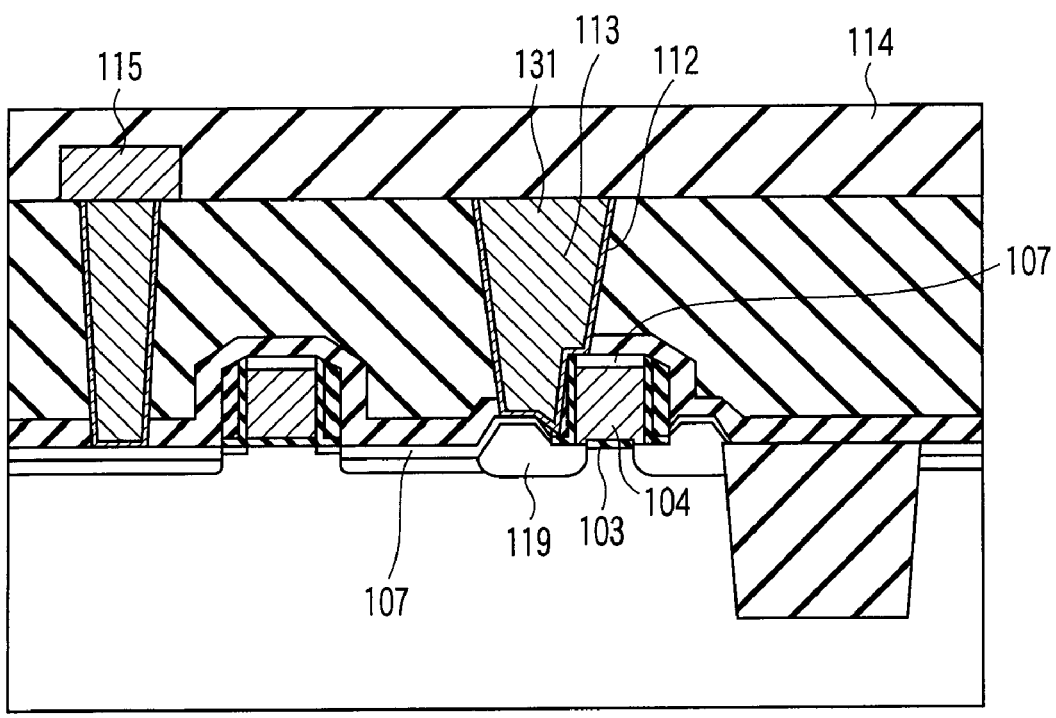
F I G. 4B

SEMICONDUCTOR DEVICE AND A METHOD OF MANUFACTURING THE SAME

CROSS-REFERENCE TO RELATED APPLICATIONS

This application is based upon and claims the benefit of priority from prior Japanese Patent Application No. 2007-042394, filed Feb. 22, 2007, the entire contents of which are incorporated herein by reference.

BACKGROUND OF THE INVENTION

1. Field of the Invention

This invention relates to a semiconductor device composed of active elements, such as MISFETs, formed on a bulk Si substrate, an SiGe substrate, or an SOI substrate, and more particularly to a semiconductor device which has a shared contact that connects a source or drain region to a gate electrode by means of a contact.

2. Description of the Related Art

In a semiconductor device, such as a static random access memory (SRAM), formed on a semiconductor substrate, a configuration which uses a shared contact that connects a source or drain region to a gate electrode by means of a contact has recently been proposed (for example, Jpn. Pat. Appln. KOKAI Publication No. 2005-158898 or The 2003 Symposium on VLSI Technology Digest of Technical Papers, pp. 13-14).

This type of shared contact has a larger hole diameter than an ordinary contact hole because the source or drain region and the gate electrode have to be connected to each other. A shared contact with a larger hole diameter has a higher etching rate. Therefore, when a shared contact and an ordinary contact are processed at the same time, the insulating film (sidewall spacer) on the sidewall of the gate electrode is liable to penetrate. If the sidewall spacer has penetrated, the shared contact comes into contact with the extension of the source/drain region. Since the extension is very thin, if the shared contact penetrates the extension, this causes a junction leak.

To avoid this problem, a method of extending the gate electrode onto the element isolation insulating film and contacting the extended part to the source/drain region has been proposed (e.g., the 2006 IEDM Technical Digest, pp. 685-688). With this method, however, since the contact area of the shared contact becomes smaller, this causes the following problems: the resistance increases and securing the contact area prevents the miniaturization of the elements.

BRIEF SUMMARY OF THE INVENTION

According to an aspect of the invention, there is provided a semiconductor device comprising: a gate insulating film formed on a semiconductor substrate; a gate electrode formed on the gate insulating film; a sidewall insulating film formed on both side faces of the gate electrode; and an impurity-doped semiconductor layer which is embedded in a surface portion of the semiconductor substrate, the semiconductor layer being formed at least one of positions which are located on both sides of the gate electrode and adjacent to the gate electrode, the semiconductor layer including a portion extended beyond a position under the sidewall insulating film and reaching a position under the gate electrode, and further including a portion penetrating the gate insulating film and being in contact with the gate electrode.

According to another aspect of the invention, there is provided a semiconductor device comprising: a first transistor which includes a gate insulating film formed on a semiconductor substrate, a gate electrode formed on the gate insulating film, a sidewall insulating film formed on both side faces of the gate electrode, and a source and a drain region formed on the semiconductor substrate so as to sandwich the gate electrode between the regions; a second transistor which has the same configuration as that of the first transistor and is arranged adjacent to the first transistor; and an impurity-doped semiconductor layer which is for connecting one of the source and drain regions of the second transistor to the gate electrode of the first transistor and which is formed in a part where the semiconductor substrate and the gate insulating film have been removed in such a manner that the surface of the semiconductor substrate is removed beyond the lower part of the sidewall insulating film and to the underside of the gate electrode on at least one of both sides of a part obtained by extending the gate insulating film, gate electrode, and sidewall insulating film of the first transistor in the gate width direction to the outside of the first transistor and the gate insulating film exposed in the removed part is removed and which makes contact with the source region or drain region of the second transistor.

According to still another aspect of the invention, there is provided a semiconductor device manufacturing method comprising: forming a gate electrode via a gate insulating film above a semiconductor substrate; forming not only a protective insulating film on the top face of the gate electrode but also a first sidewall insulating film on both side faces of the gate electrode; etching the semiconductor substrate with the protective insulating film and the first sidewall insulating film as a mask to remove at least one of the surface parts of the semiconductor substrate adjacent to both sides of the gate electrode beyond the lower part of the first sidewall insulating film and to the underside of the gate electrode and further remove the gate insulating film exposed in the removed part; embedding an impurity-doped semiconductor layer in the part where the semiconductor substrate and the gate insulating film have been removed; removing the first sidewall insulating film after the semiconductor layer is formed; and forming a second sidewall insulating film on both side faces of the gate electrode after the first sidewall insulating film has been removed.

BRIEF DESCRIPTION OF THE SEVERAL VIEWS OF THE DRAWING

FIGS. 3A to 3H are sectional views to help explain the manufacturing processes of a semiconductor device according to the first embodiment;

FIGS. 4A and 4B are sectional views to help explain the manufacturing processes of a semiconductor device according to a second embodiment of the invention.

DETAILED DESCRIPTION OF THE INVENTION

Reference Example

Before an explanation of embodiments of the invention, a reference example of forming a shared contact which contacts the source or drain region of a MOS transistor with the gate electrode will be explained.

Figure 5A:
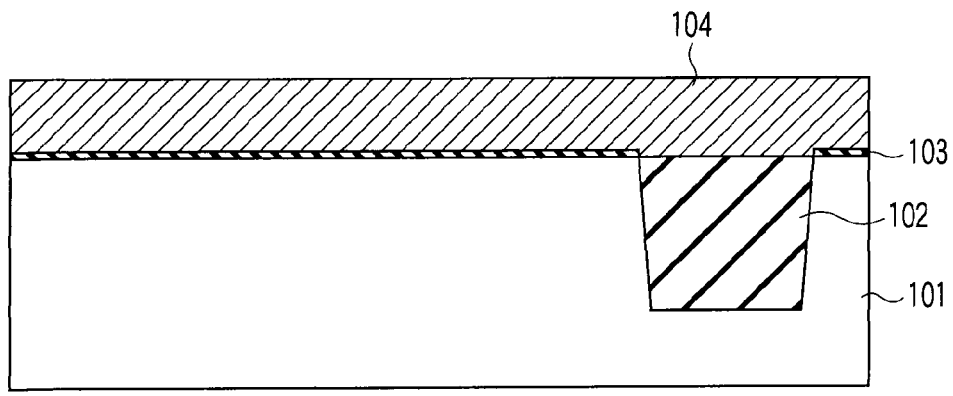
FIGS. 5A to 5H are sectional views to help explain the manufacturing processes of a semiconductor device according to a reference example of the invention.

As shown in FIG. 5A, an insulating film is embedded in a groove about 300 nm in depth made in the surface of an Si substrate 101, thereby forming an element isolating region 102. Then, impurities to make a well/channel are introduced into the Si substrate 101. Further on the Si substrate 101, a gate insulating film 103 and a gate electrode 104 are deposited to a thickness of about 1 nm and a thickness of about 100 nm, respectively.

Figure 5B:
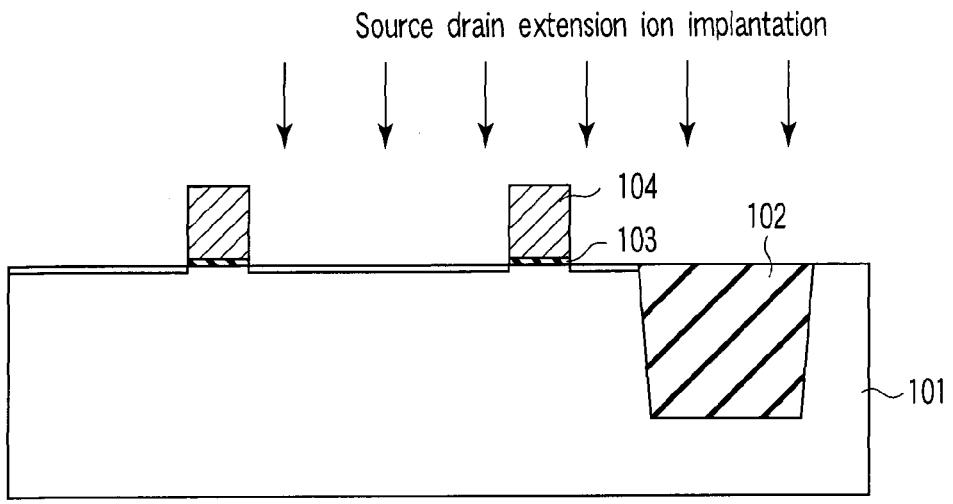

Next, as shown in FIG. 5B, by lithographic techniques and dry etching, the gate electrode 104 is processed with the gate insulating film 103 as a stopper. Then, by ion implantation, impurities to make an extension of a source/drain region are introduced.

Figure 5C:
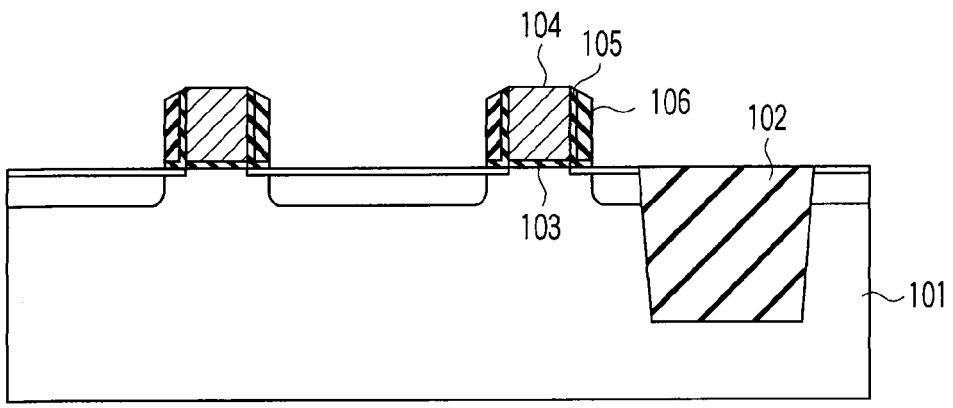

Next, as shown in FIG. 5C, from the viewpoint of securing the transistor characteristic and reliability, a sidewall insulating film (sidewall spacer) for keeping the source/drain region about 30 nm away from the gate electrode 104 is formed. At this time, etching damage in the sidewall spacer processing has to be prevented from being done to the Si substrate 101. For this reason, after a first thin $SiO_2$ film 105 is formed, a first SiN film 106 is deposited in such a manner that its film thickness is adjusted so as to produce a desired sidewall width. Then, after the first SiN film 106 is processed with the first $SiO_2$ film 105 as a stopper, the remaining first $SiO_2$ film 105 is removed.

Figure 5D:
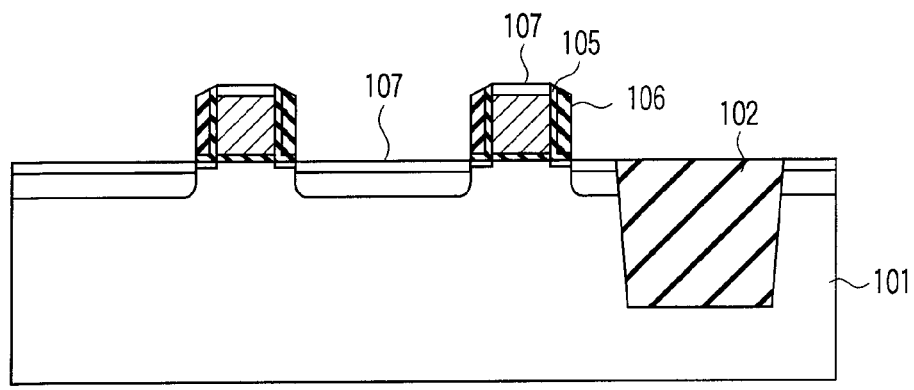

After the sidewall spacer is processed, impurities to make the source/drain region are introduced and activated. Thereafter, to decrease the interconnect resistance of the source/drain region and gate electrode, metal, such as Ti, Co, or Ni, is deposited to form an alloy layer (salicide) 107 as shown in FIG. 5D.

Figure 5E:
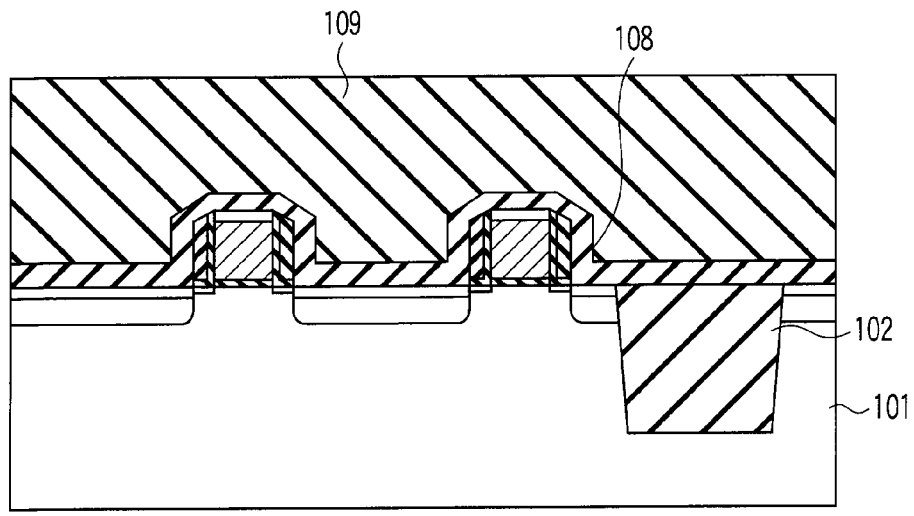

Next, as shown in FIG. 5E, after a second SiN film 108 acting as an etching stopper in forming a contact later and a second $SiO_2$ film 109 serving as a interlayer insulating film are deposited, the second $SiO_2$ film 109 is planarized by CMP techniques.

Figure 5F:
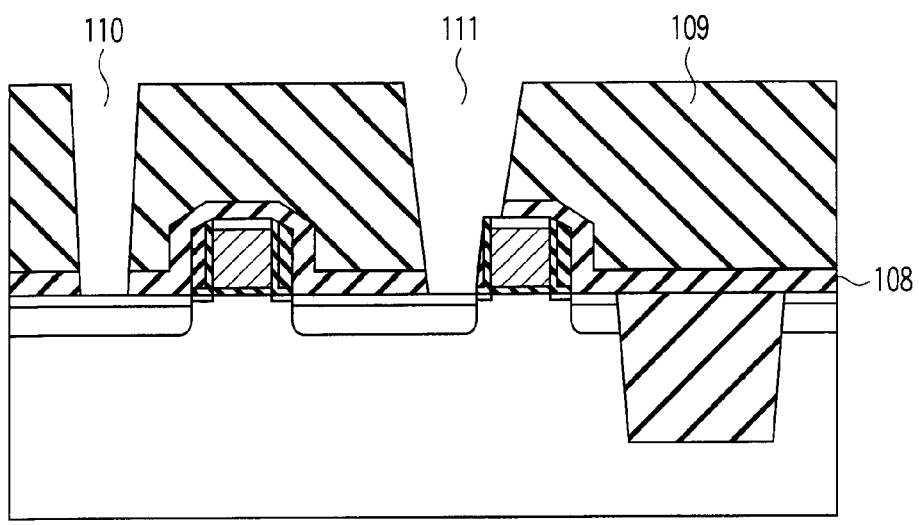

Next, as shown in FIG. 5F, an opening is made in the second $SiO_2$ film 109 by dry-etching the film 109 using the second SiN film 108 as an etching stopper. Then, after the etching condition is changed, an opening is made in the second SiN film 108, thereby making contact holes 110, 111. Here, number 110 indicates an ordinary contact hole and number 111 indicates a contact hole for a shared contact.

Figure 5G:
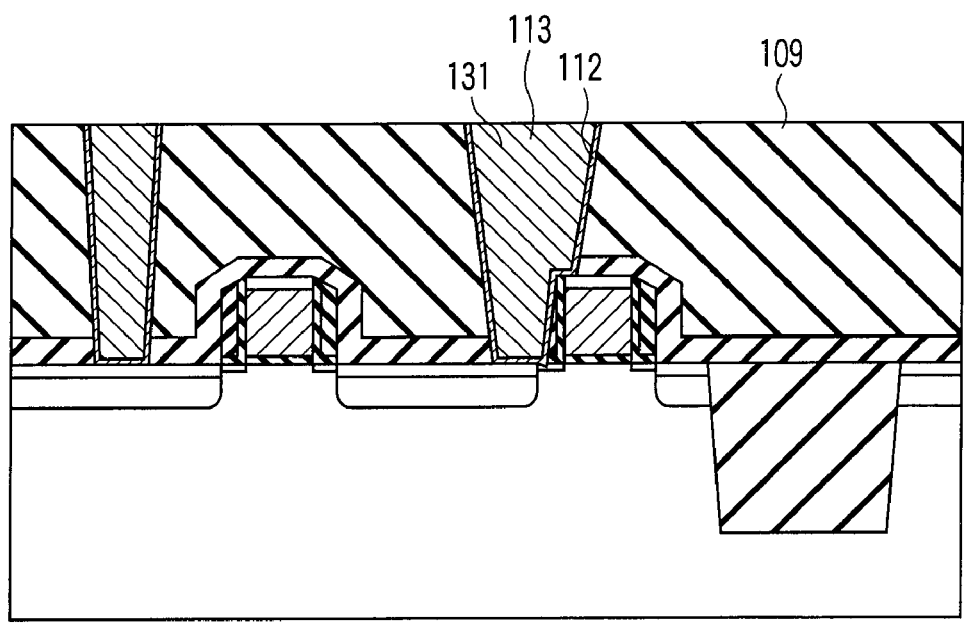

After the contact holes are made, barrier metal 112, such as TiN, and metal 113, such as W, are deposited as shown in FIG. 5G. Thereafter, the barrier metal 112 and metal 113 are removed only on the second $SiO_2$ film 109 by CMP techniques, thereby filling the contact holes 110, 111 with the metals 112, 113. At this time, a contact hole 111 is made so as to extend over the source or drain region and the gate electrode 104, thereby forming a shared contact 131 which causes the metal 113 to connect both of the source and drain regions or the drain region with the gate electrode 104.

Figure 5H:
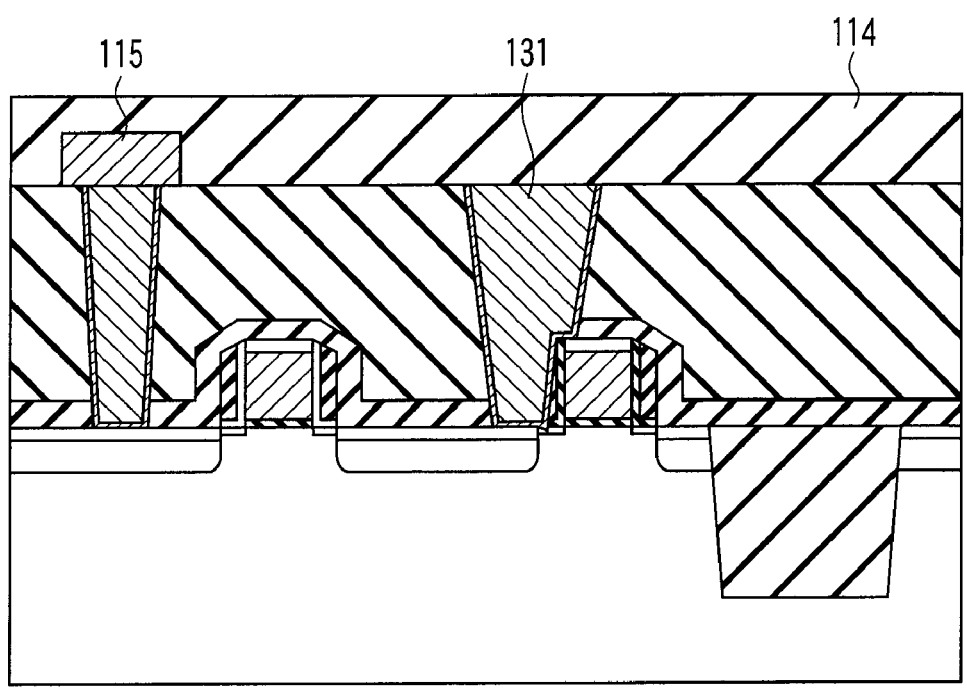

From this point on, an interlayer insulating film 114 and a metal interconnect 115 are formed and the transistors are connected to one another via contacts, thereby obtaining an element structure with a shared contact 131 as shown in FIG. 5H.

However, with the above configuration, the sidewall spacer is liable to penetrate when the contact hole 111 for a shared contact is formed, causing a problem: the shared contact 113 penetrates the extension, leading to a junction leak.

Hereinafter, embodiments of the invention which has solved the above problem will be explained.

First Embodiment

Figure 1:
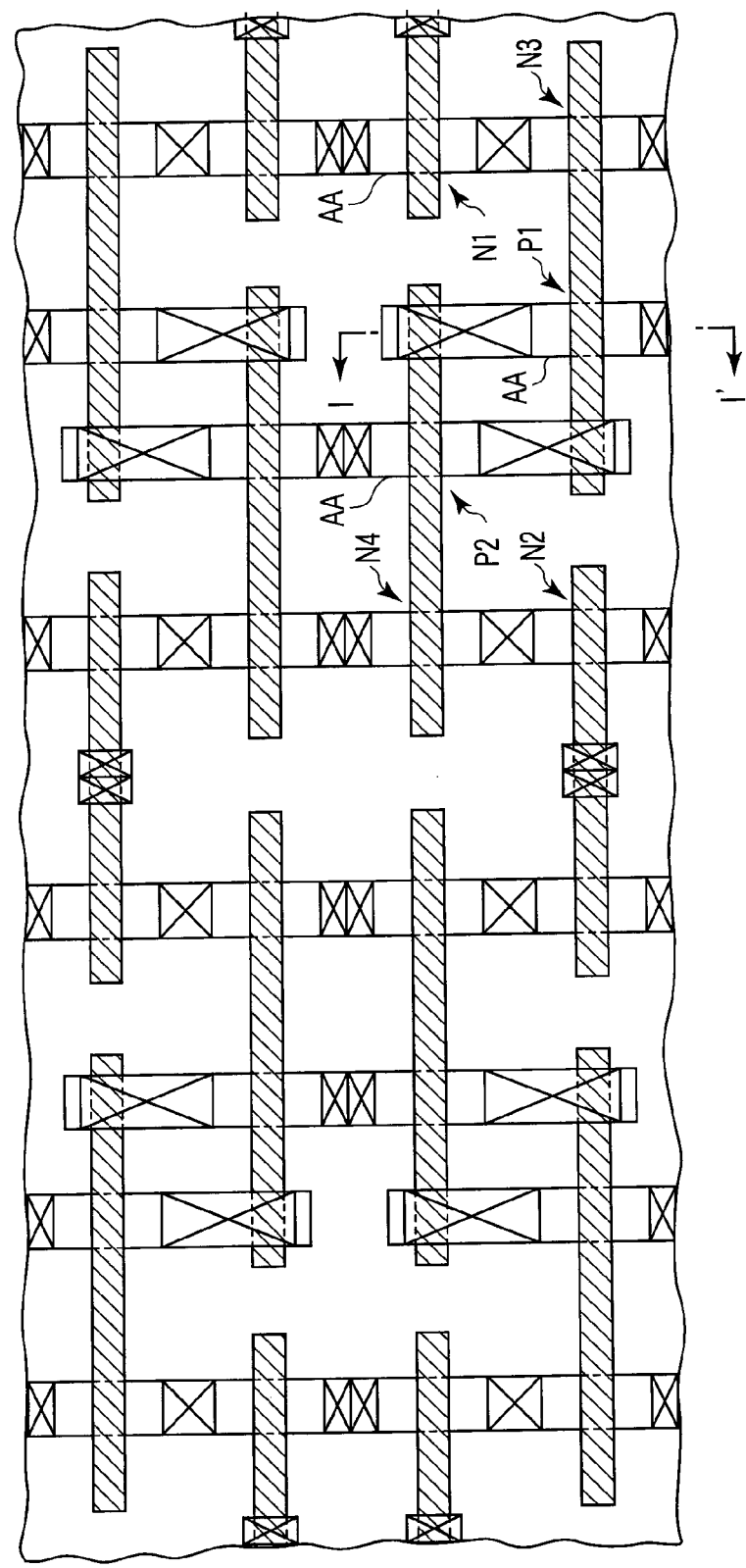
FIG. 1 is a plan view schematically showing the configuration of an SRAM according to a first embodiment of the invention.
Figure 2:
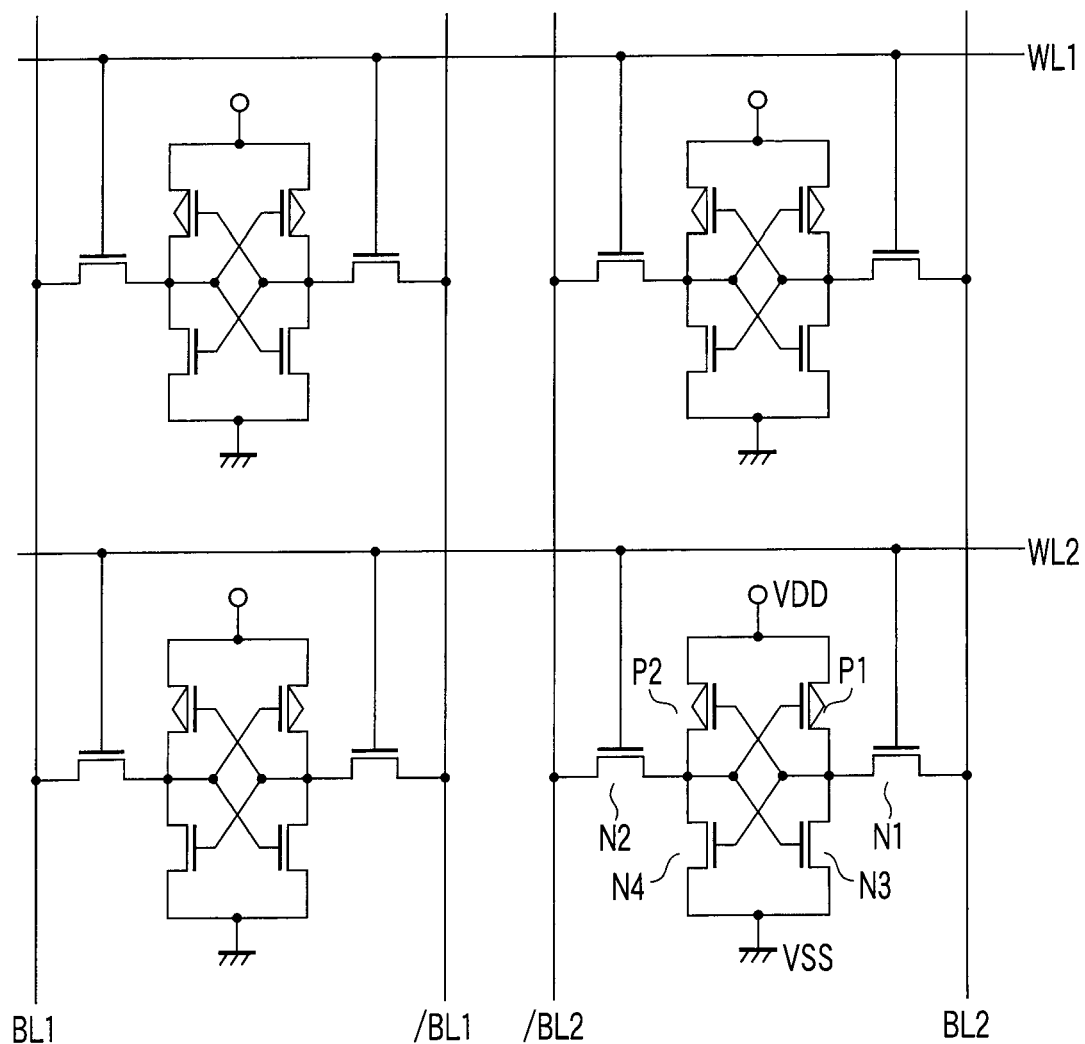
FIG. 2 is an equivalent circuit diagram of FIG. 1.

FIG. 1 is a plan view schematically showing the configuration of an SRAM according to a first embodiment of the invention. In FIG. 1, a plane pattern of four normal bit cells in two rows×two columns is shown. In a basic layout pattern of the normal bit cells, the p-channel MOSFET (pMOS) P1 and P2 parts of a bit cell shown in an equivalent circuit diagram of FIG. 2 are arranged in the column direction. The n-channel MOSFET (nMOS) N1 and N3 parts and N2 and N4 parts are arranged on both sides of the P1 and P2 parts in the row direction. In the basic layout pattern, a contact between the drain of N1 and a bit line BL and a contact between the drain of N2 and a complementary bit line/BL are positioned diagonally. These contacts are shared with normal bit cells adjacent to each other in the column direction. Similarly, a contact between the gate of N1 and a word line WL and a contact between the gate of N2 and the word line WL are positioned diagonally. These contacts are shared with normal bit cells adjacent to each other in the row direction.

The junction nodes of P1, N1, and N3 are arranged so as to be connected to the gate patterns of P2 and N4 and the junction nodes of P2, N2, and N4 are arranged so as to be connected to the gate patterns of P1 and N3. That is, they are connected in a so-called cross-coupling manner. The normal bit cells are arranged in such a manner that the basic layout pattern is arranged repeatedly in the column direction so as to be line-symmetric with respect to the position of the bit line contact and further is arranged repeatedly in the row direction so as to be line-symmetric with respect to the position of the word line contact. With this arrangement, a memory cell is configured. In FIG. 1, AA indicates active regions where the source/drain regions and channels of MOSFET are formed. Around the active regions, element isolating regions are formed.

The embodiment is characterized by the way a shared contact is configured to connect the source or drain region with the gate electrode in a specific MOSFET in an SRAM with the above configuration. This will be explained with reference to FIGS. 3A to 3H. FIGS. 3A to 3H correspond to sectional views taken along line I-I' of FIG. 1. That is, FIGS. 3A to 3H correspond to a sectional view of a MOS transistor P1 and a shared contact part adjacent to the MOS transistor.

First, as shown in FIG. 3A, after a gate insulating film 103 and a gate electrode 104 are deposited on an Si substrate 101 with element isolating regions 102, a third SiN film is deposited on the gate electrode 104 as explained in the reference example.

Next, as shown in FIG. 3B, after the third SiN film 116 is processed into a gate pattern, the gate electrode 104 and gate insulating film 103 are processed using the third SiN film 116 as a hard mask. Then, as in the reference example, impurities are introduced into the extension of the source/drain region. Here, the transistor part at left in FIG. 3B corresponds to P1 (second transistor) in FIGS. 1 and 2 and the transistor part at right in FIG. 3B is a region where a shared contact is made.

Next, as shown in FIG. 3C, after a third $SiO_2$ film is deposited, a resist 118 having an opening in the source or drain region and the gate electrode region is formed by lithographic techniques. Then, with the resist 118 as a mask, the third $SiO_2$ film 117 is dry-etched. As a result, in the vicinity of the gate electrode 104 where a shared contact is to be formed, the third $SiO_2$ film 117 is left only on the sidewall of the gate electrode 104. That is, a first sidewall insulating film composed of the SiO$_2$ film 117 is formed on both sides of the gate electrode 104.

Figure 3D:
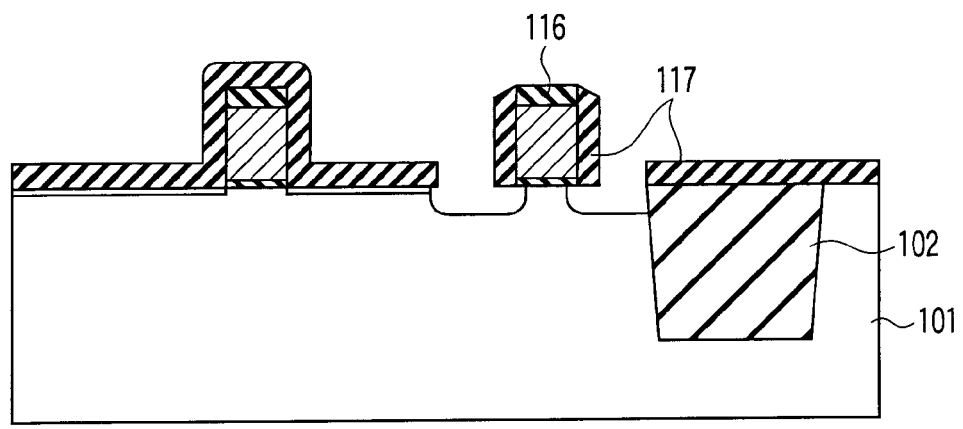

Next, as shown in FIG. 3D, after the resist 118 is removed, the Si substrate 101 is etched isotropically by dry etching or the like, using the third SiO$_2$ film 117 and third SiN film 116 as a mask. As a result, the exposed surface part of the Si substrate 101 is removed beyond the lower part of the first sidewall insulating film and to the underside of the gate electrode 104.

Figure 3E:
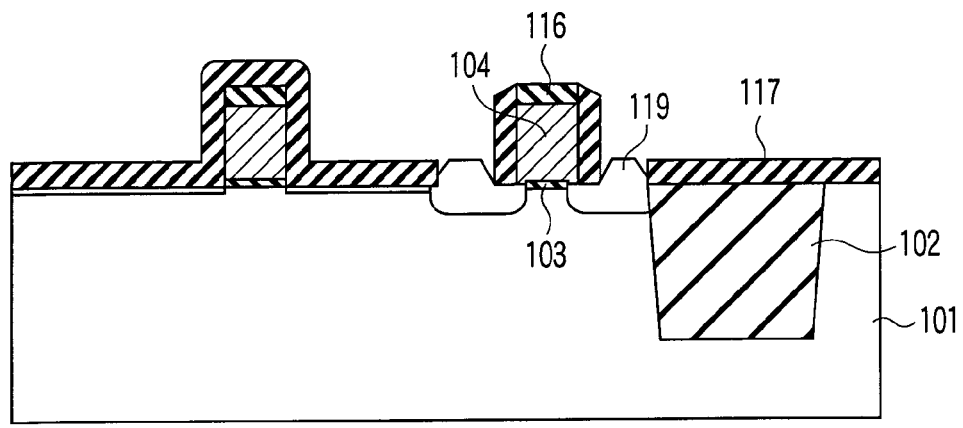

Next, as shown in FIG. 3E, a part of the gate insulating film 103 which is adjusted to the side wall of the gate electrode is exposed as a result of etching the Si substrate 101, and the part is removed. After removing, a semiconductor layer 119 into which impurities, such as B, P, or As, have been introduced by selective growth is deposited. As a result, the source/drain region and the gate electrode 104 are connected directly with each other at the underside of the gate electrode.

Figure 3F:
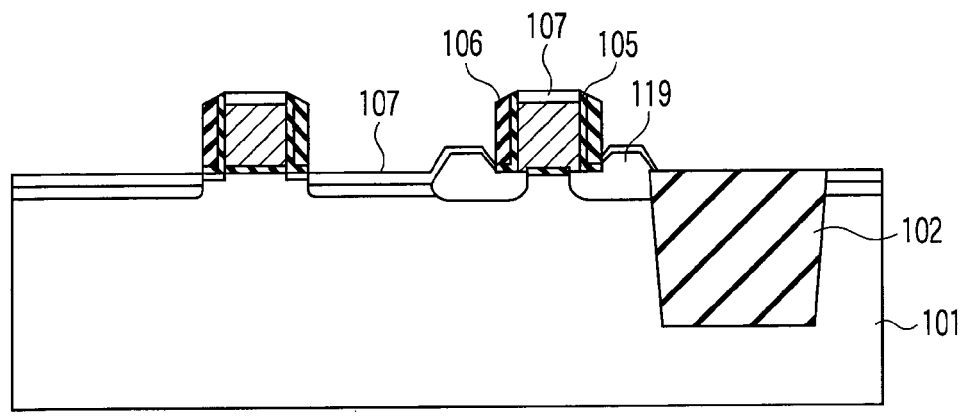

Next, as shown in FIG. 3F, after the third SiN film 116 and third SiO$_2$ film 117 are removed, a sidewall spacer (second sidewall insulating film) is composed of a first SiO$_2$ film 105 and a first SiN film 106 as in the reference example. In addition, a source and a drain region formed on the Si substrate 101 so as to sandwich the gate electrode 104. Then, after a metal film is deposited on the entire surface, annealing is done, thereby forming salicide 107.

Figure 3G:
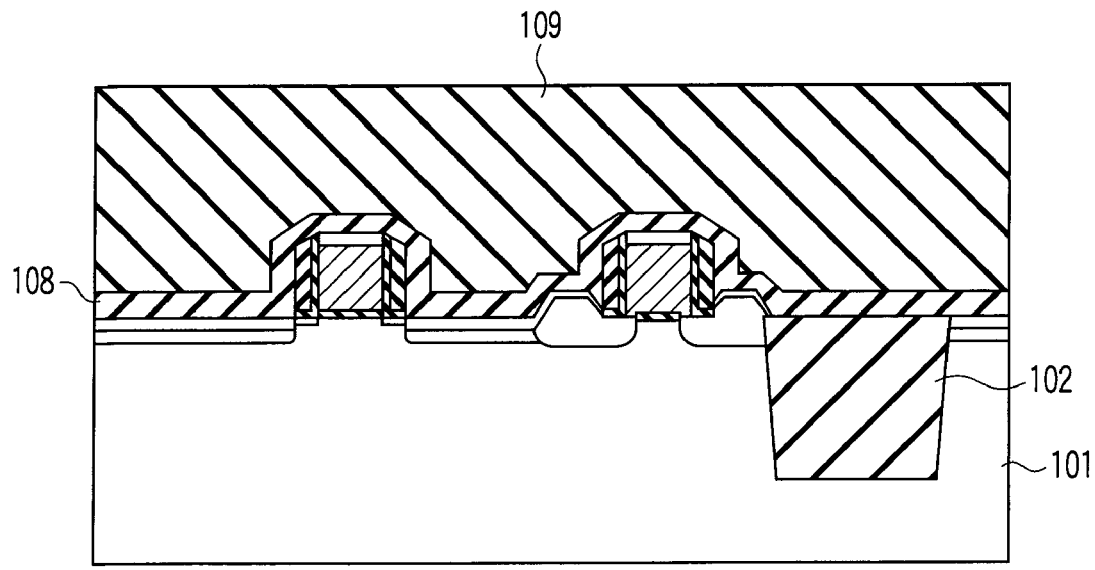

Next, as shown in FIG. 3G, after a second SiN film 108 is formed, a second SiO$_2$ film is deposited and planarized as in the reference example.

Figure 3H:
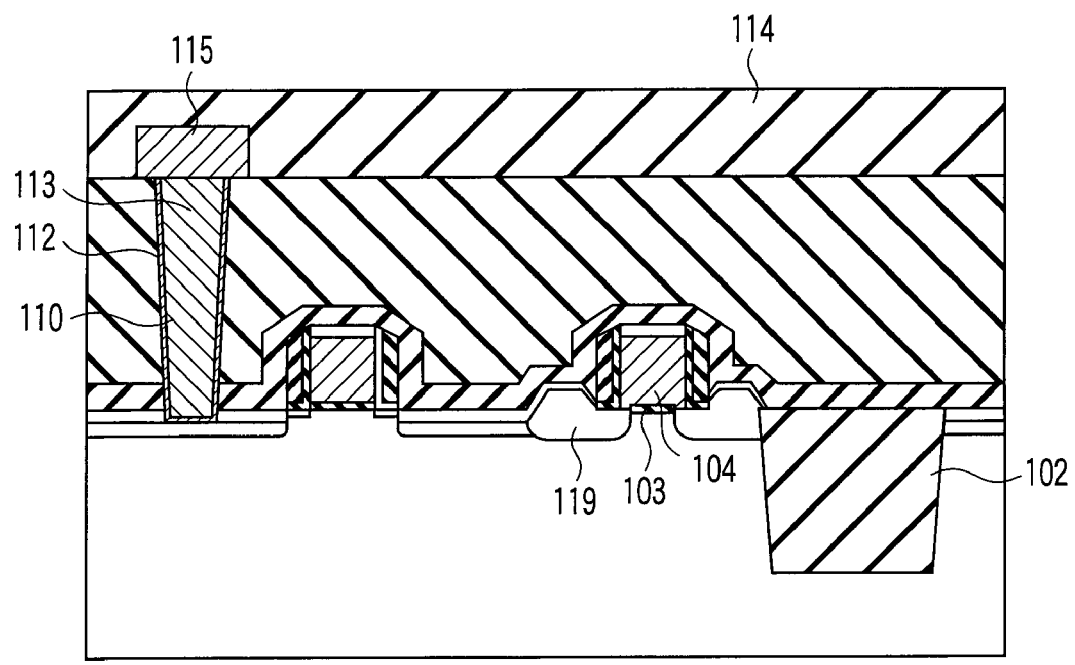

Next, as shown in FIG. 3H, after a contact hole 110 is formed, the contact hole 110 is filled with barrier metal 112 and metal 113. Then, an interlayer insulating film 114 and a metal interconnect 115 are formed.

As a result, the source or drain region of P1 (second transistor) is connected to the gate electrode of P2 (first transistor) as shown in FIGS. 1 and 2.

That is to say, the semiconductor layer 119 being formed at least one of positions which are located on both sides of the gate electrode 104 and adjacent to the gate electrode 104, the semiconductor layer 119 including a portion extended beyond a position under the sidewall insulating film 106 and reaching a position under the gate electrode 104, and further including a portion penetrating the gate insulating film 103 and being in contact with the gate electrode 104.

As described above, with the first embodiment, the semiconductor layer 119 made of SiGe connects the source/drain region to the gate electrode 104, thereby realizing a low-resistance connection without increasing the area of the shared contact. Moreover, the extension of the source/drain region is replaced with SiGe into which impurities have been introduced, which makes it possible to avoid a sidewall spacer penetration problem even if an ordinary shared contact is used. Accordingly, a lower resistance connection is possible. Moreover, since the gate electrode 104 need not be extended onto the element isolating region to make contact with the source/drain region, this prevents the resistance and necessary contact area from increasing.

Consequently, it is possible to suppress a junction leak caused by the shared contact penetrating the extension and contact the regions without increasing the area and resistance, which enables the element characteristics to be secured and the elements to be miniaturized more.

Second Embodiment

FIGS. 4A and 4B are process sectional views showing the configuration of a shared contact part used in an SRAM according to a second embodiment of the invention. In FIGS. 4A and 4B, the same parts as those in FIGS. 3A to 3H are indicated by the same reference numbers and a detailed explanation of them will be omitted.

The second embodiment differs from the first embodiment in that the underside of the gate electrode 104 and the semiconductor layer 119 are directly contacted each other to connect the source or drain region to the gate electrode 104 and that a contact for connecting the top face of the gate electrode 104 and the salicide 107 is provided as in the reference example.

Specifically, in the second embodiment, the second SiO$_2$ film 109 is planarized (FIG. 3G) as in the first embodiment. At this time, since the source or drain region has already been connected to the gate electrode 104, a contact hole for a shared contact need not be newly made.

However, in the second embodiment, as shown in FIG. 4A, from the viewpoint of the reduction of the contact resistance, a contact hole 111 is made at the same time a normal contact hole 110 is made.

From this point on, as shown in FIG. 4B, barrier metal 112 and metal 113 are formed in the contact holes 110, 111 and then an interlayer insulating film 114 and a metal interconnect 115 are formed, thereby producing a structure with a shared contact 131 as in the reference example.

As described above, with the second embodiment, not only can the same shared contact as that in the first embodiment be formed, but also the shared contact 131 provided on the gate electrode 104 and salicide layer 107 can contact the electrode 104 and the layer 107. Consequently, the contact resistance between the source or drain region and the gate electrode 14 can be made lower. In this case, on both sides of the gate electrode 104, a semiconductor layer 119 made of SiGe is formed by growth. This prevents a junction leak from occurring even if the sidewall spacer penetrates.

(Modification)

The invention is not limited to the above embodiments. In the embodiments, although both of the source and drain regions are connected to the gate electrode in the transistor structure of the shared contact part, only one of the source and drain regions may be connected to the gate electrode. Moreover, the semiconductor layer selectively grown in the part where the semiconductor substrate and gate insulating film have been etched is not necessarily limited to an SiGe layer. For instance, Si or SiC may be used. The transistors are not restricted to a MOS structure and may, of course, have a MIS structure which uses an insulating film other than an oxide film as a gate insulating film.

Furthermore, the configuration of the static RAM is not limited to FIGS. 1 and 2 and may be changed as needed. Moreover, the invention is not necessarily limited to the shared contact part of the static RAM and may be applied to various types of semiconductor devices which have a shared contact that connects the source or drain region to the gate electrode in a MISFET.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:
1. A semiconductor device comprising:
a gate insulating film formed on a semiconductor substrate;

a gate electrode formed on the gate insulating film, the gate electrode being thicker than the gate insulating film;

a sidewall insulating film formed on both side faces of the gate electrode; and an impurity-doped semiconductor layer which is embedded in a surface portion of the semiconductor substrate, the semiconductor layer being formed at least one of positions which are located on both sides of the gate electrode and adjacent to the gate electrode, the semiconductor layer including a portion extended beyond a position under the sidewall insulating film and reaching a position under the gate electrode, and further including a portion penetrating the gate insulating film and being in contact with the gate electrode.

2. The semiconductor device according to claim 1, wherein the semiconductor layer constitutes a source and a drain region.

3. The semiconductor device according to claim 1, wherein the semiconductor layer is made of Si, SiGe, or SiC.

4. The semiconductor device according to claim 1, further comprising a contact which is formed so as to continuously cover at least a part of the upper part of the semiconductor layer, at least a part of the upper part of the gate electrode, and the upper part of the sidewall insulating film between the semiconductor layer and the gate electrode.

5. The semiconductor device according to claim 1, wherein the sidewall insulating film has a two-layer structure of an $SiO_2$ film and an SiN film.

6. The semiconductor device according to claim 1, wherein the surface of the semiconductor substrate has its parts adjacent to the sidewall insulating film removed beyond the lower part of the sidewall insulating film and to the underside of the gate electrode.

* * * * *